(12) United States Patent
Inguva et al.

(10) Patent No.: US 9,864,016 B2
(45) Date of Patent: Jan. 9, 2018

(54) BATTERY SYSTEM PACK LIFE ESTIMATION SYSTEMS AND METHODS

(71) Applicant: GM GLOBAL TECHNOLOGY OPERATIONS LLC, Detroit, MI (US)

(72) Inventors: Sudhakar Inguva, Troy, MI (US); Austen Bernardi, Davis, CA (US); Ramesh Rebba, Rochester Hills, MI (US); Ryan B. Moulliet, Farmington Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 292 days.

(21) Appl. No.: 14/530,376

(22) Filed: Oct. 31, 2014

(65) Prior Publication Data

US 2016/0124052 A1    May 5, 2016

(51) Int. Cl.
*H01M 10/50* (2006.01)
*G01R 31/36* (2006.01)
*H01M 10/48* (2006.01)

(52) U.S. Cl.
CPC ..... *G01R 31/3679* (2013.01); *G01R 31/3651* (2013.01); *H01M 10/48* (2013.01); *H01M 10/486* (2013.01); *H01M 2220/20* (2013.01)

(58) Field of Classification Search
CPC .......... G01R 31/3679; G01R 31/3651; H01M 10/486; H01M 10/48; H01M 2220/20
USPC ........................................................... 429/90
See application file for complete search history.

(56) References Cited

U.S. PATENT DOCUMENTS

2010/0324846 A1* 12/2010 Marsh ................ G01R 31/3679
                                                         702/63

* cited by examiner

*Primary Examiner* — Gary Harris
(74) *Attorney, Agent, or Firm* — Phillips Ryther & Winchester; John P. Davis

(57) ABSTRACT

System and methods for estimating a life of a battery pack are presented. In certain embodiments, a method for estimating a life of a battery pack may include generating cell-level test data that includes measured parameters a of battery cell included in the battery pack in response to a plurality of test conditions. One or more first thermal response parameters associated with the battery cells of the battery pack may be determined. A battery cell aging model may be generated based, at least in part, on the cell-level test data and the one or more first thermal response parameters. Second thermal response parameters associated with the battery pack may be determined, and an estimated life of the battery pack may be determined based, at least in part, on the battery cell aging model and the second thermal response parameters.

10 Claims, 4 Drawing Sheets

BATTERY SYSTEM PACK LIFE ESTIMATION SYSTEMS AND METHODS

TECHNICAL FIELD

This disclosure relates to systems and methods for estimating a life of a battery pack. More specifically, but not exclusively, the systems and methods disclosed herein relate to estimating a life of a battery pack included in a vehicle based on cell degradation data and pack thermal characterization.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("ESS") included in a vehicle may be used to power electric drivetrain components of the vehicle.

Accurately estimating a pack life of a battery system may allow for more accurate battery system control and/or management decisions to be made based on such information and/or inform battery system engineering and/or design, thereby improving overall battery performance. Accurate estimation of a life of a battery system may further allow for improved diagnostics and/or prognostic methods to identify potential battery system issues.

Conventional methods for estimating the life of a battery system at a pack level may utilize time-intensive long-term pack level testing and characterization. Such testing and characterization may involve extensive use of testing equipment such as multi-channel battery cyclers over relatively long periods of time. Conventional methods may further require individual testing and characterization of a particular battery pack configuration that may not be extendable to a variety of other pack configurations, thereby increasing the time and expense of testing and characterizing a variety of different pack configurations.

SUMMARY

Systems and methods disclosed herein may, among other things, provide for more accurate determination and/or estimation of a life of a battery system at a pack level, thereby improving battery system design, control, management, and diagnostic decisions. In some embodiments, the disclosed systems and methods may reduce time-intensive long-term pack level testing and characterization of a battery system in connection with estimating battery pack life. In yet further embodiments, the disclosed systems and methods may be utilized in connection with a variety of pack configurations and may reduce the need to perform long-term pack level testing and characterization of each individual pack configuration of interest.

In certain embodiments, the systems and methods disclosed herein may be used to estimate a pack life of a battery (e.g., a battery included in a vehicle) based, at least in part, on cell degradation data and/or pack thermal characterization obtained over a relatively short period (e.g., 1 day or the like). A variety of thermal parameters may be estimated in connection with the pack thermal characterization including, without limitation, pack thermal resistance, pack heat transfer coefficients, pack thermal entropy, and/or the like and be used to characterize an estimated full thermal trace of the battery pack over its life. Although exemplary embodiments disclosed herein may be utilized in connection with a lithium-ion ("Li-Ion") battery pack, it will be appreciated that embodiments may be similarly utilized in connection with a variety of other battery technologies, chemistries, and/or combinations thereof.

In some embodiments, a method for estimating the life of a battery pack may include receiving cell-level test data comprising measured parameters a of battery cell included in the battery pack in response to a plurality of test conditions relating to a performance degradation of the battery cell over time based on the plurality of test conditions. In certain embodiments, the plurality of test conditions may include ambient temperature conditions, cell root-mean-squared power conditions, cell state of charge conditions, cell set point conditions, cell duty cycle conditions, and/or the like.

One or more first thermal response parameters associated with the battery cells may be determined. In some embodiments, the first thermal response parameters may include a thermal resistive parameter, a heat transfer coefficient parameter, an entropic parameter, and/or a maximum temperature parameter, although other thermal parameters may be utilized. In certain embodiments, the one or more first thermal response parameters may be determined by performing a regression using cell thermal data included in the cell-level test data. In further embodiments, the one or more first thermal response parameters may be determined based on a generated battery cell thermal model configured to estimate a thermal response of the battery cell.

A battery cell aging model may be generated based, at least in part, on the cell-level test data and the one or more first thermal response parameters. Second thermal response parameters associated with the battery pack may be determined. In some embodiments, the second thermal response parameters may be determined by performing a regression using pack thermal data included in pack-level test data comprising measured parameters of the battery pack in response to the plurality of test conditions. In further embodiments, the second thermal response parameters may be determined based on a generated battery pack thermal model configured to estimate a thermal response of the battery pack. A life of the battery pack (e.g., a pack capacity life and/or a pack resistance life) may be generated based, at least in part, on the battery cell aging model and the second thermal response parameters.

In certain embodiments, the aforementioned method may be performed by battery control electronics associated with a battery pack and/or a battery testing and/or characterization system and/or implemented using a non-transitory computer-readable medium storing associated executable instructions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Figure 1:
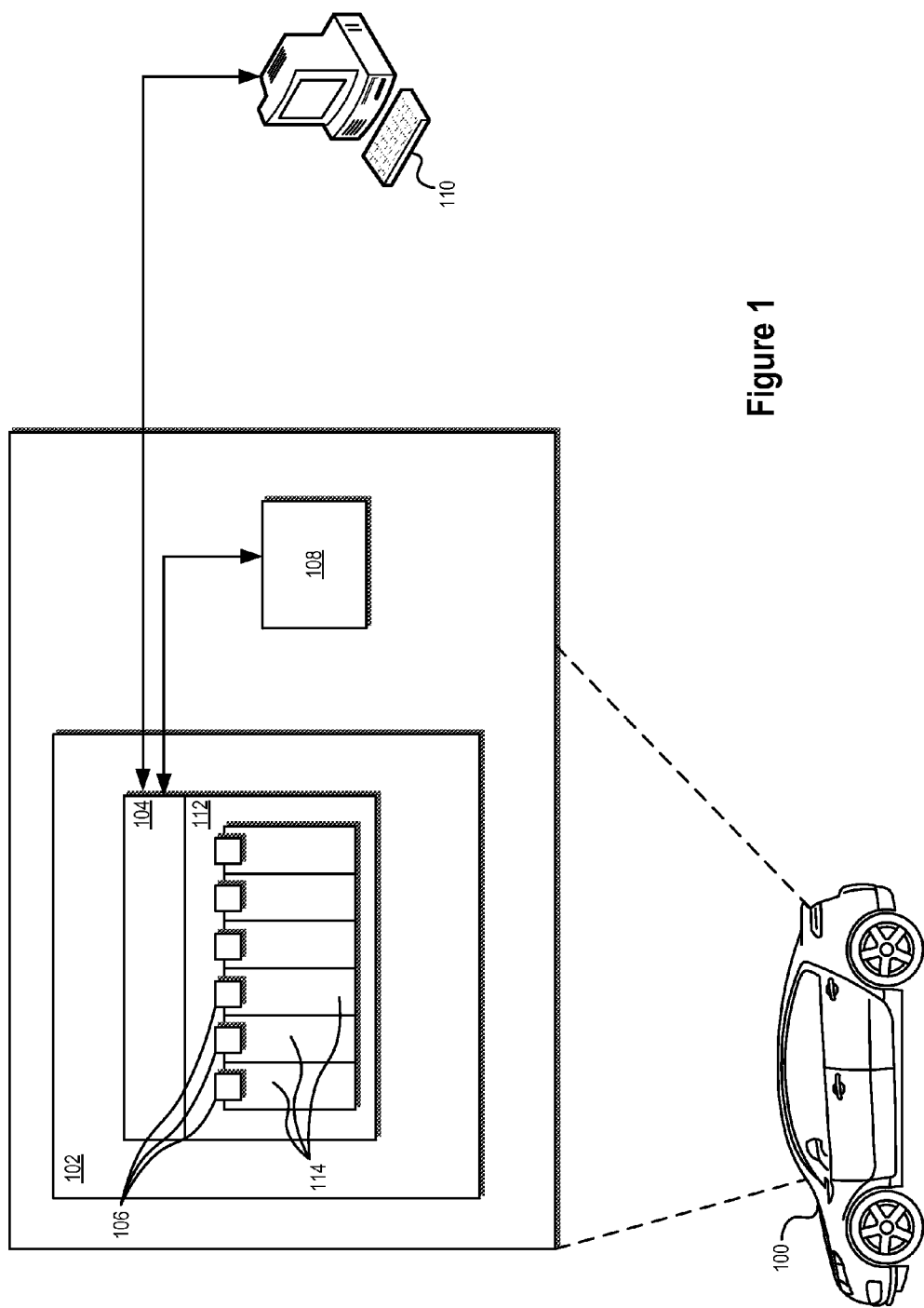
FIG. 1 illustrates an exemplary system for estimating a life of a battery pack included in a battery system of a vehicle consistent with embodiments disclosed herein.

FIG. 1 illustrates an exemplary system for estimating a life of a battery pack 112 included in a battery system 102 of a vehicle 100 consistent with embodiments disclosed herein. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. In certain embodiments, the battery system 102 may be an HV battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle systems including, for example, vehicle starter systems (e.g., a starter motor), lighting systems, ignition systems, and/or the like.

The battery system 102 may include a battery control system 104. The battery control system 104 may be configured to monitor and control certain operations of the battery system 102. For example, the battery control system 104 may be configured to monitor and control charging and discharging operations of the battery system 102.

In certain embodiments, the battery control system 104 may be utilized in connection with the methods disclosed herein to estimate a pack life of the battery system 102 and/or any of its constituent battery packs 112 (e.g., for use in connection with real time battery system state of health ("SOH") estimations, thermal performance of a battery system and/or an associated cooling system for diagnostic and/or prognostic determinations, and/or the like). In certain embodiments, the battery control system may be communicatively coupled with one or more sensors 106 (e.g., voltage sensors, current sensors, temperature sensors, and/or the like, etc.) and/or other systems configured to enable the battery control system to monitor and control operations of the battery system 102. For example, sensors 106 may provide battery control system 104 with information used to estimate a temperature, a capacity, a pack life, a state of charge ("SOC") and/or SOH, estimate a resistance, measure a current, and/or measure voltage of the battery system 102 and/or its constituent components.

The battery control system 104 may further be configured to provide information to and/or receive information from other systems included in the vehicle 100. For example, the battery control system 104 may be communicatively coupled with an internal vehicle computer system 108 and/or an external computer system 110 (e.g., via a wireless telecommunications system or the like). In certain embodiments, the battery control system 104 may be configured, at least in part, to provide information regarding the battery system 102 (e.g., information measured by sensors 106 and/or determined by control system 104) to a user of the vehicle 100, vehicle computer system 108, and/or external computer system 110. Such information may include, for example, estimated capacity, pack life, SOC, and/or SOH information, battery operating time information, battery operating temperature information, and/or any other information regarding the battery system 102.

The battery system 102 may include one or more battery packs 112 suitably sized to provide electrical power to the vehicle 100. Each battery pack 112 may include one or more subdivisions 114 (e.g., cells). The subdivisions 114 may comprise sub-packs, each of which may comprise one or more battery cells utilizing any suitable battery technology or combination thereof. Suitable battery technologies may include, for example, lead-acid, nickel-metal hydride ("NiMH"), Li-Ion, Li-Ion polymer, lithium-air, nickel-cadmium ("NiCad"), valve-regulated lead-acid ("VRLA") including absorbed glass mat ("AGM"), nickel-zinc ("NiZn"), molten salt (e.g., a ZEBRA battery), nickel manganese cobalt ("NMC"), lithium iron phosphate ("LFP"), lithium manganese oxide ("LMO"), and/or other suitable battery technologies and/or combinations thereof.

Each subdivision 114 may be associated with a sensor 106 configured to measure one or more parameters (e.g., temperature, voltage, current, impedance, SOC, etc.) associated with each battery subdivision 114. Although FIG. 1 illustrates separate sensors 106 associated with each battery subdivision 114, in some embodiments a sensor configured to measure various electrical parameters associated with a plurality of subdivisions 114 may also be utilized. In certain embodiments, the sensors 106 may be configured to measure a temperature of one or more associated battery subdivisions 114. In certain embodiments, the sensors 106 may comprise one or more thermistors, although it will be appreciated that other types of temperature measurement sensors may be utilized in connection with the disclosed systems and methods including, without limitation, thermocouples, infrared temperature sensors, thermostats, thermometers, change-of-state temperature sensors, silicon diode temperature sensors, and/or the like.

The electrical parameters measured by sensors 106 may be provided to battery control system 104 and/or one or more other systems. Using the electrical parameters, battery control system 104 and/or any other suitable system may coordinate the operation of battery system 102 (e.g., charging operations, discharging operations, balancing operations, etc.). In certain embodiments, one or more electrical parameters may be provided by battery control system 104 and/or one or more sensors 106 to vehicle computer system 108 and/or external computer system 110. Based on certain measured parameters, battery control system 104, vehicle computer system 108, and/or any other suitable system (e.g., a testing and/or characterization system) may estimate a pack life of a battery pack 112 of battery system 102 utilizing embodiments of the methods disclosed herein.

Figure 2:
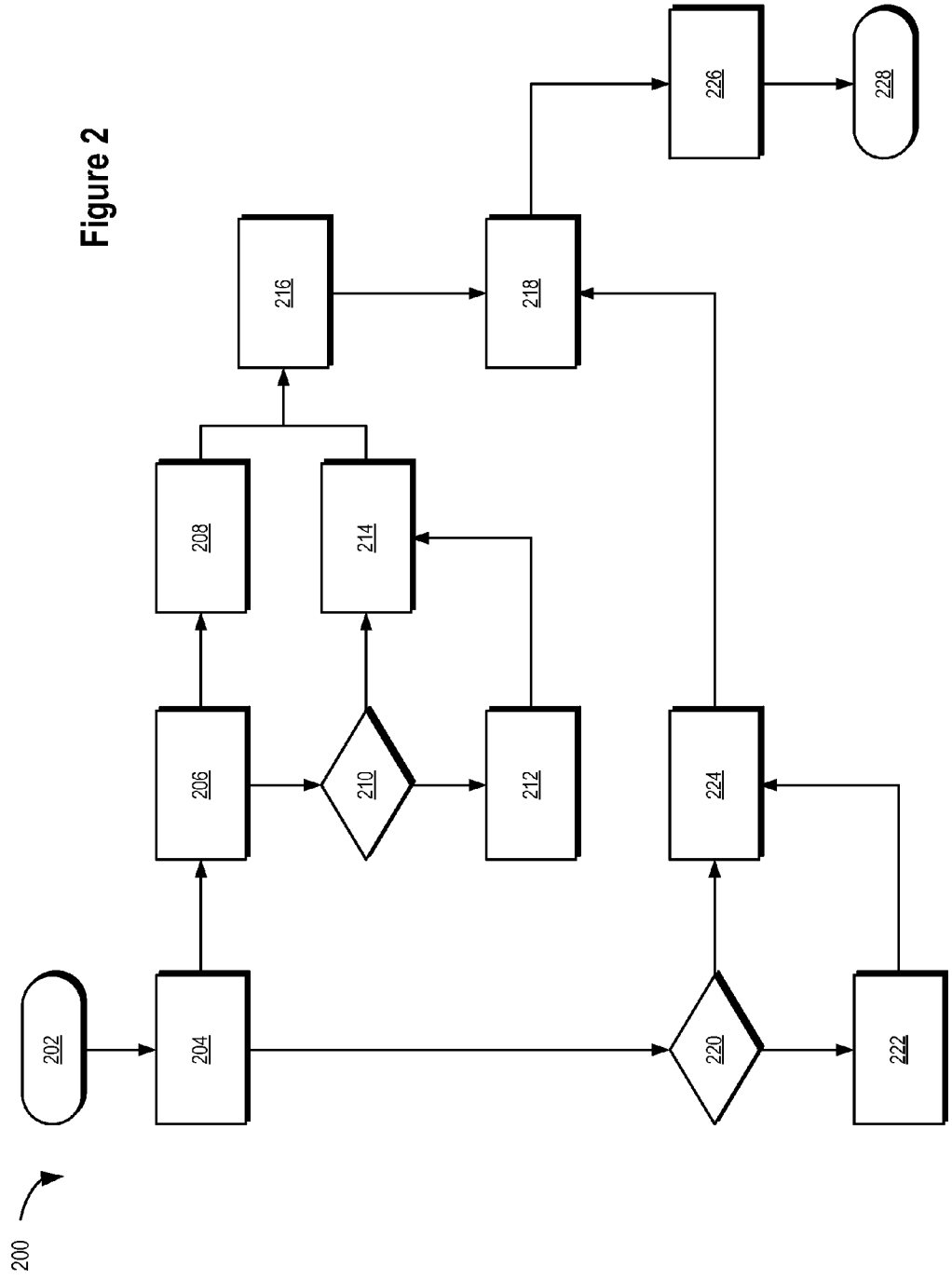
FIG. 2 illustrates a flow chart of an exemplary method for estimating a life of a battery system consistent with embodiments disclosed herein.

FIG. 2 illustrates a flow chart of an exemplary method 200 for estimating a life of a battery system consistent with embodiments disclosed herein. In some embodiments, one or more of the elements of the illustrated conceptual diagram may be performed by and/or implemented using a battery control system, a vehicle computer system, an external computer system, a battery back testing and/or characterization system (e.g., a system including and/or communicatively coupled to a battery cell/pack testing cycler and/or the like) and/or any other system or combination of systems configured to implement battery pack life estimation methods consistent with the disclosed embodiments.

At 202, the method 200 may initiate. At 204, test conditions may be identified for characterizing and/or otherwise measuring a variety of cell response parameters (e.g., using battery cycler testing equipment and/or the like). In certain embodiments, the test conditions may comprise various combinations of testing parameters for a cell including, without limitation, ambient temperature, RMS power, change in cell SOC, cell SOC set point, cell charge depletion, cell charge neutral energy ratio and/or cell duty cycle, although other test conditions may also be utilized. It some embodiments, the test conditions may comprise conditions that impact a life of the battery pack. In certain embodiments, the test conditions may be included in a cell test matrix.

At 206, cell-level test data may be collected based, at least in part, on the test conditions identified at 204. In certain embodiments, the cell-level test data may comprise various cell measurement data including, without limitation, an indication of how capacity of the cell degrades and/or how a resistance of the cell changes over time (e.g., a charging and/or a discharging resistance) in response to the varied test conditions over time), profiles of transient thermal response (i.e., temperature), current response, and/or transient response of the battery cell in response to various identified test conditions. In some embodiments, the cell-level test data may be obtained using, at least in part, a battery cycler and/or any other suitable measurement system.

A cell aging model may be constructed at 208. In certain embodiments, the cell aging model may comprise a formula or set of formulae determined using Kriging and/or any other suitable regression or interpolation response surface technique or combination of techniques in connection with the cell-level test data to predict battery performance degradation based on variable parameter inputs. In some embodiments, the cell aging model may estimate capacity decrease and/or resistance increase of a cell for the cell life testing conditions to end-of-life ("EOL") criteria for the cell using trend analysis and/or any other suitable regression technique. In certain embodiments, the EOL criteria may be specified based on a certain percentage capacity loss and/or resistance increase for the cell.

At 210, a determination may be made as to whether cell-level temperature test data and/or a sufficient amount of cell-level temperature test data has been collected (e.g., collected in connection with cell-level test data collected at 206) for use in connection with extracting cell-level thermal parameters. In certain embodiments, cell-level temperature test data may be utilized to construct a cell-level thermal model used to enhance the cell aging model. If cell-level temperature test data and/or a sufficient amount of cell-level has not been collected, a cell-level thermal model may be constructed at 212. In certain embodiments, the cell-level thermal model may be based on an equivalent circuit model (e.g., an RC circuit model) used to approximate the thermal behavior of a battery cell and/or generate various transient responses such as voltage, heat generation, and/or temperature responses and/or the like.

Figure 3:
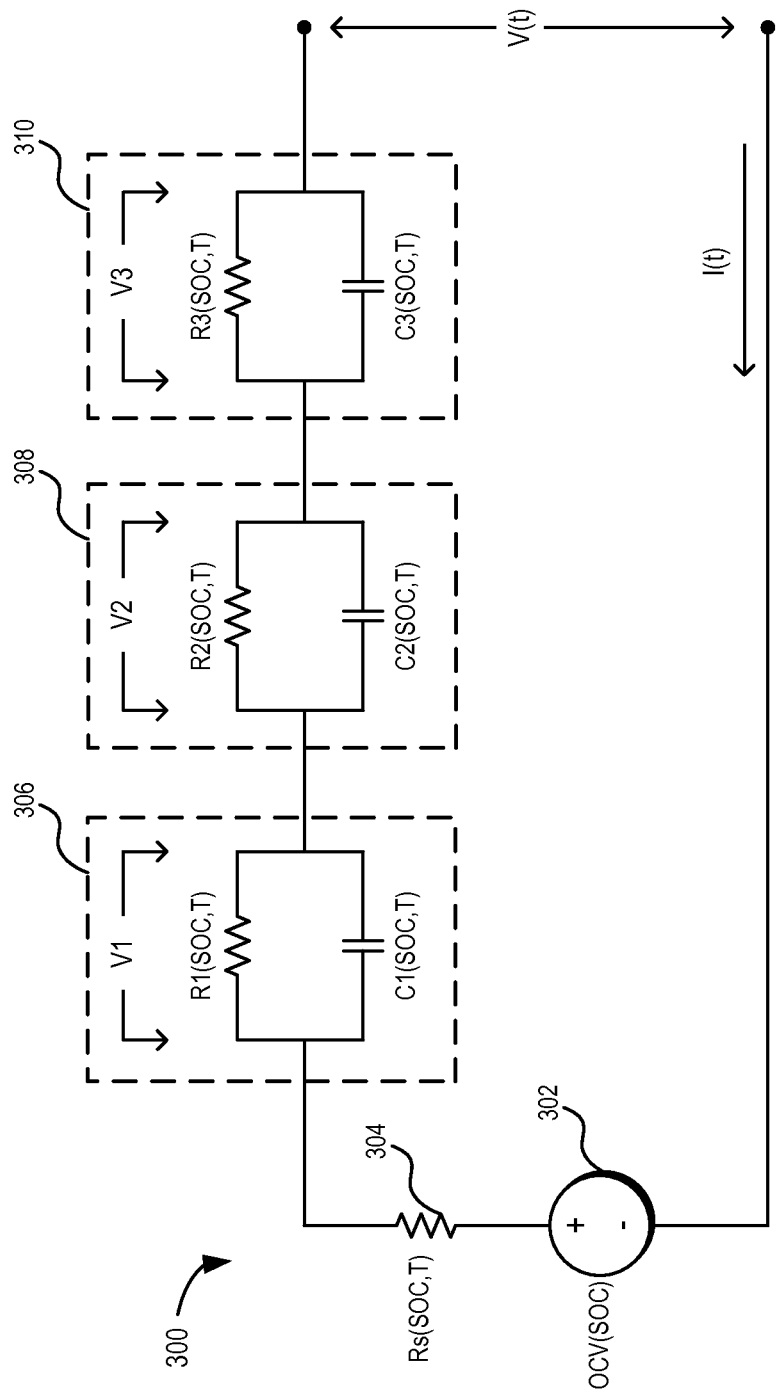
FIG. 3 illustrates an exemplary circuit model for modeling a battery cell consistent with embodiments disclosed herein.

Referring to FIG. 3, an exemplary circuit model 300 for modeling various responses of a battery cell is illustrated consistent with embodiments disclosed herein. As illustrated, the exemplary circuit model 300 may comprise a plurality of resistor-capacitor parallel pairs 306-310 coupled in series (e.g., three resistor-capacitor pairs). The resistances of the resistors of the resistor capacitor pairs 306-310 are denoted in the Figure as R1, R2, and R3, and may have values that are based on an SOC and a temperature of an associated battery cell. The capacitances of the of the capacitors of the resistor capacitor pairs 306-310 are denoted in the Figure as C1, C2, and C3, and may have values that are based on an SOC and a temperature of an associated battery cell.

The resistor-capacitor pairs 306-310 may be coupled in series with a resistor 304 having a resistance denoted as $R_s$ in the figure and a value based on an SOC and a temperature of an associated battery cell. In certain embodiments, resistor 304 may be configured to model an ohmic resistance of the associated battery cell. Resistor 304 and resistor-capacitor pairs 306-310 may be coupled in series with a voltage source 302 configured to model an open circuit voltage of an associated battery cell that, in certain embodiments, may depend on a SOC of the battery cell. Various parameter values of the electrical components 302-310 may be selected so as to approximate an electrical-thermal behavior of an associated battery system. In certain embodiments, these parameters may be estimated based on data obtained in connection with a hybrid pulse power characterization ("HPPC") test of a battery cell. In some embodiments, the data may be generated in connection with a HPPC test at a variety of operating temperatures, (e.g., −10° C. and 25° C.), and may provide an indication of a transient current and temperature response over time of an associated battery cell.

Referring again to FIG. 2, at 214, for each test condition used in connection with the collection of cell-level test data collected at 206, cell-level thermal parameters may be extracted and/or regressed from the available cell-level temperature test data and/or based on the cell-level thermal model constructed at 212. In certain embodiments, three cell-level thermal parameters may be extracted and/or regressed including a thermal resistive term, a heat transfer coefficient and/or heat convection term, and an entropic term, although in further embodiments a variety of other thermal parameters may be extracted, regressed, and/or otherwise utilized in connection with the disclosed embodiments. Maximum cell-level temperature values may also be determined at 214.

In certain embodiments, the thermal resistive term, denoted as $m_1$, the entropy term heat transfer coefficient and/or convention term, denoted as $m_2$, and the heat transfer coefficient and/or heat convention term, denoted as $m_3$, may be expressed according to:

$$m_1 = \frac{R(T_r)}{T_a M C_p} \qquad \text{Eq. 1}$$

$$m_2 = \frac{\Delta S}{nFMC_p} \qquad \text{Eq. 2}$$

$$m_3 = \frac{hA}{MC_p} \qquad \text{Eq. 3}$$

where:

$T_r$ is a reference temperature, K;
$T_a$ is an initial ambient temperature at time 0, K;
R is resistance at $T_r$, Ω (Ohms);
M is mass of a cell, kg;
$C_p$ is a cell heat capacity pressure, J(Joules)/kg;
$\Delta S$ is an entropy of reaction, J/mole/K;
η is a current efficiency;
F is Faraday's constant, 96487 C equivalent, coulombs/mole;
h is a heat transfer coefficient, w/m²/K; and
A is surface area of a cell, m².

In certain embodiments, the thermal resistive term, heat transfer coefficient and/or heat convention term, and entropic term may be used in connection with a thermal model equation expressed according to:

$$\frac{T(t_i)}{T_a} = \qquad \text{Eq. 4}$$

$$\frac{T(t_{i-1})}{T_a} + \Delta t \left[ m_1 \exp\left[ -\frac{E_A}{R_{gas} T(t_{i-1})} \left( \frac{1}{T(t_{i-1})} - \frac{1}{T_r} \right) \right] \left( \frac{I_{i-1}^2 + I_i^2}{2} \right) + \right.$$

$$\left. m_2 \left( \frac{T(t_{i-1})}{T_a} \right) \left( \frac{I_{i-1} + I_i}{2} \right) + m_3 \left( 1 - \left( \frac{T(t_{i-1})}{T_a} \right) \right) \right],$$

$i = 0, 1, 2, 3, \ldots, n \quad T(0) = T_a$ where:

$T(t_i)$ is temperature at time ti where "i" goes from 0 to n;
'n' is a length of time series such that to represents the time duration of a cell being tested;
$\Delta t$ is time step; a
$E_A$ is an activation energy parameter, J/mol;
$R_{gas}$ is a universal gas constant, (e.g., 8.31446 J/mol/K); and
I is a current, amperes.

At 216, the cell aging model constructed at 206 may be enhanced with the cell-level thermal parameters determined at 214. For example, the thermal resistive term, heat transfer coefficient and/or heat convection term, entropic term, and maximum temperature term may be utilized in constructing an enhanced cell aging model. In certain embodiments, these thermal parameters may be utilized in connection a Kriging and/or any other suitable regression or interpolation response surface technique or combination of techniques used in connection with determining the cell aging model.

A determination may be made at 220 as to whether pack-level temperature test data and/or a sufficient amount of pack-level temperature test data associated with the test conditions identified at 204 is available for use in connection with extracting pack-level thermal parameters. In certain embodiments, such pack-level temperature test data may be generated over a relatively short testing duration (e.g., a day) for each test condition identified at 204.

If pack-level temperature data and/or a sufficient amount of pack-level temperature data is not available, a pack-level thermal model may be constructed at 222. In certain embodiments, the pack-level thermal model based on an equivalent circuit model (e.g., and RC model) that includes a plurality of circuit models used to model each consistent battery cell (e.g., a plurality of exemplary cell-level circuit models as illustrated in connection with FIG. 4). In further embodiments, a thermal network may be utilized in addition to the equivalent circuit model. In certain embodiments, the thermal network may be represented by an RC circuit model having associated circuit parameters modeling thermal conductivity and/or a head transfer coefficient of a cell. Based on the pack-level thermal model, various pack-level transient responses may be generated including, for example, voltage, heat generation, and/or temperature responses and/or or the like for each cell included in the particular pack configuration.

At 224, pack-level thermal parameters for each constituent cell included in the pack may be extracted and/or regressed from the available pack-level temperature test data and/or based on the pack-level thermal model constructed at 222. In some embodiments, the pack-level thermal parameters may comprise a pack-level thermal resistive term, a pack-level heat transfer coefficient and/or heat convention term, a pack-level entropic term, and a pack-level maximum temperature term. In certain embodiments, when used in connection with the cell aging model and the cell thermal model, pack-level thermal parameters may be extracted and/or otherwise regressed using the pack-level thermal model over an extended period of time (e.g., a year or the like).

A battery pack aging model may be constructed at 218 that may generate information regarding degradation of a battery pack and/or each cell in the battery pack over time based on the enhanced cell aging model and the pack-level thermal parameters. In certain embodiments, degradation and/or information relating to a life of a battery pack and/or a cell in the battery pack for a particular test condition may be calculated based, at least in part, on a pack capacity life and/or pack resistance life calculation. In certain embodiments, pack capacity life, $Life_{PackCap}$, for variable life parameters from battery pack beginning-of-life ("BOL") to EOL may be expressed according to:

$$C_{p(j+\Delta T)} = \left[ \frac{n}{100 * \left[ \frac{1}{C_{10} * (D_{1j} - \%\Delta Deg_{1j})} + \frac{1}{C_{20} * (D_{2j} - \%\Delta Deg_{2j})} + \ldots + \frac{1}{C_{n0} * (D_{nj} - \%\Delta Deg_{nj})} \right]} \right] \qquad \text{Eq. 5}$$

$$\%\Delta Deg_{ij} = \frac{1}{L_{ij}^a} * \left[ \left( (100 - D_{ij})^{\frac{1}{a}} * L_{ij} + X^{\frac{1}{a}} \Delta t \right)^a - (100 - D_{ij}) * L_{ij}^a \right] \qquad \text{Eq. 6}$$

$$Life_{PackCap} = \text{Time } 'j' \text{ when: } \frac{(C_{P0} - C_{Pj}) * 100}{C_{P0}} = X \qquad \text{Eq. 7}$$

where:

$C_{p(j+\Delta T)}$ is a capacity decay of pack at time 'j' during a small time interval $\Delta T$;
$C_{10}, C_{20} \text{ - - - } C_{n0}$ is an initial capacity of cells 1, 2, - - - n;
$\%\Delta Deg_{1j}, \%\Delta Deg_{2j} \text{ - - - } \%\Delta Deg_{nj}$ is a percentage of capacity degradation of cells 1, 2 - - - n at time 'j' during a small time interval $\Delta T$;
$C_{P0}$ is an initial capacity of pack at time '0';

$C_{Pj}$ is a final capacity of pack at time 'j';

%deg$_{ij}$=A percent of capacity degradation of cell 'i' at time 'j' during a time interval 'Δt' (e.g., in years);

a=Time dependence exponent for given condition obtained from test data and standard regression (e.g., 0.5 to 1);

$D_{ij}$=State of capacity of cell 'i' at time 'j'—may be assumed to take the generic form $$100 - x\left(\frac{i}{L_{ij}}\right)^a;$$

$L_{ij}$=Life (e.g., in years) for x % of degradation (e.g., x %—25 for 25% as pack EOL) for a given instantaneous condition during time Δt. The condition may be dependent on several battery life factors such as, for example, temperature, SOC, RMS power, Duty Cycle (% of time of cell operation during a period like 1-day), and/or the like;

X=% capacity degradation for EOL of cell 'i'; and

Δt=Time increment (e.g., in years).

In certain embodiments, pack resistance life, Life$_{PackRes}$, for variable life parameters from battery pack BOL to EOL may be expressed according to:

$$Re_{pj} = [Re_{cell\_1j} + Re_{cell\_2j} + \cdots + Re_{cell\_nj}] \quad \text{Eq. 8}$$

$$Re_{pj} = \left[\frac{Re_{10} * R_{1j}}{100} + \frac{Re_{20} * R_{21j}}{100} + \cdots + \frac{Re_{n0} * R_{nj}}{100}\right] \quad \text{Eq. 9}$$

$$Re_{p(j+\Delta T)} = \quad \text{Eq. 10}$$

$$\left[\frac{Re_{10} * (R_{1j} + \%\Delta\text{Rise}_{1j})}{100} + \frac{Re_{20} * (R_{2j} + \%\Delta\text{Rise}_{2j})}{100} + \cdots + \frac{Re_{n0} * (R_{nj} + \%\Delta\text{Rise}_{nj})}{100}\right]$$

$$\%\Delta\text{Rise}_{ij} = \quad \text{Eq. 11}$$

$$\frac{1}{L_{ij}^a} * \left[\left((R_{ij} - 100)^{(\frac{1}{a})} * L_{ij} + X^{(\frac{1}{a})}\Delta t\right)^a - (R_{ij} - 100) * L_{ij}^a\right]$$

$$\text{Life}_{PackRes} = \text{Time } 'j' \text{ when:} \frac{(Re_{pj} - Re_{P0}) * 100}{Re_{P0}} = X \quad \text{Eq. 12}$$

where:

$Re_{p(j+\Delta T)}$ is a resistance increase of pack at time 'j' during a small time interval ΔT $Re_{10}$, $Re_{20}$ - - - $Re_{n0}$ is an initial resistance of cells 1, 2, - - - n;

%ΔRise$_{1j}$, %ΔRise$_{2j}$ - - - %ΔRise$_{nj}$ is a percentage resistance rise of cells 1, 2 - - - n at time 'j' during a small time interval Δt;

$Re_{P0}$ is an initial resistance of pack at time '0';

$Re_{Pj}$ is a final resistance of pack at time 'j';

%ΔRise$_{ij}$=A percentage increase in resistance of cell 'i' at time 'j' during a time interval 'Δt' (e.g., in years);

a=Time dependence exponent for a given condition obtained from test data and standard regression (e.g., 0.5 to 1);

$R_{ij}$=State of resistance of cell 'i' at time 'j' and may assumed to take the generic form $$x\left(\frac{i}{L_{ij}}\right)^a;$$

$L_{ij}$=Life (e.g., in years) for x % of resistance rise (e.g., x %=50 for 50% resistance rise at pack EOL) for a given instantaneous condition during time Δt. The condition may be dependent on several battery life factors including, without limitation, temperature, SOC, RMS power, duty cycle (e.g., % of time of cell operation during a period of 1-day);

X=% resistance rise for EOL of cell 'i'; and

Δt=Time increment (e.g., in years).

Using Equations 5-11, a pack capacity life, Life$_{PackCap}$, and a pack resistance life, Life$_{PackRes}$, for the battery pack may be calculated at 226. The method 200 may proceed to terminate at 228.

Figure 4:
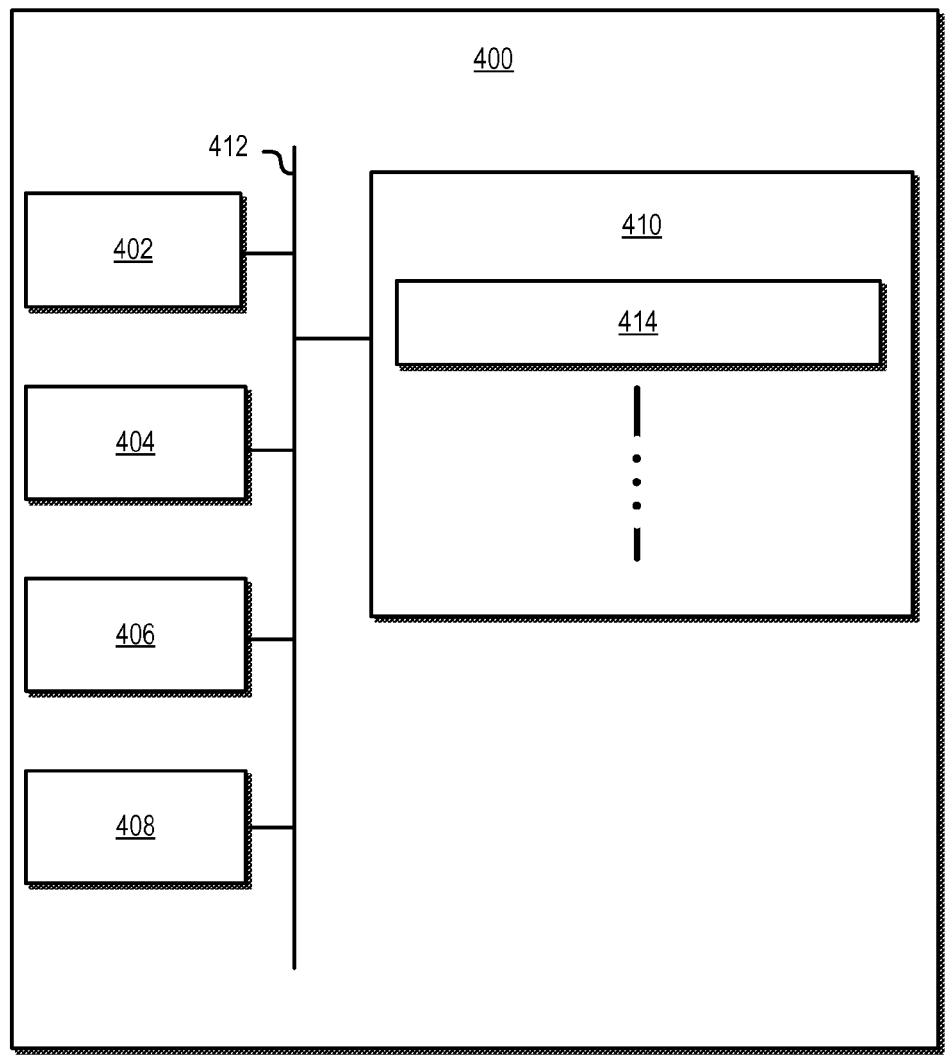
FIG. 4 illustrates an exemplary system for implementing certain embodiments of the systems and methods disclosed herein.

FIG. 4 illustrates an exemplary system for implementing certain embodiments of the systems and methods disclosed herein. In certain embodiments, the computer system 400 may be a personal computer system, a server computer system, an on-board vehicle computer, a battery control system, a battery testing system, and/or any other type of system suitable for implementing the disclosed systems and methods. In further embodiments, the computer system 400 may be any portable electronic computer system or electronic device including, for example, a notebook computer, a smartphone, and/or a tablet computer.

As illustrated, the computer system 400 may include, among other things, one or more processors 402, random access memory ("RAM") 404, a communications interface 406, a user interface 408, and a non-transitory computer-readable storage medium 410. The processor 402, RAM 404, communications interface 406, user interface 408, and computer-readable storage medium 410 may be communicatively coupled to each other via a common data bus 412. In some embodiments, the various components of the computer system 400 may be implemented using hardware, software, firmware, and/or any combination thereof.

The user interface 408 may include any number of devices allowing a user to interact with the computer system 400. For example, the user interface 408 may be used to display an interactive interface to a user. The user interface 408 may be a separate interface system communicatively coupled with the computer system 400 or, alternatively, may be an integrated system such as a display interface for a laptop or other similar device. In certain embodiments, the user interface 408 may be produced on a touch screen display. The user interface 408 may also include any number of other input devices including, for example, keyboard, trackball, and/or pointer devices.

The communications interface 406 may be any interface capable of communicating with other computer systems, peripheral devices, and/or other equipment communicatively coupled to computer system 400. For example, the communications interface 406 may allow the computer system 400 to communicate with other computer systems (e.g., computer systems associated with external databases and/or the Internet), allowing for the transfer as well as reception of data from such systems. The communications interface 406 may include, among other things, a modem, a satellite data transmission system, an Ethernet card, and/or any other suitable device that enables the computer system 400 to connect to databases and networks, such as LANs, MANs, WANs and the Internet. In further embodiments, the communications interface 406 may further be capable of communication with one or more sensors and/or other systems configured to measure and/or otherwise provide information for use in connection with the disclosed embodiments.

Processor 402 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 402 may be configured to execute computer-readable instructions stored on non-transitory computer-readable storage medium 410. Computer-readable storage medium 410 may store other data or information as desired. In some embodiments, the computer-readable instructions may include computer executable functional modules 414. For example, the computer-readable instructions may include one or more functional modules configured to implement all or part of the functionality of the systems and methods described above. Specific functional models that may be stored on computer-readable storage medium 410 may include a module configured to perform battery system pack life estimation methods and/or associated calculations consistent with embodiments disclosed herein, and/or any other module or modules configured to implement the systems and methods disclosed herein.

The system and methods described herein may be implemented independent of the programming language used to create the computer-readable instructions and/or any operating system operating on the computer system 400. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 400 may be in response to user commands, results of previous processing, or a request made by another processing machine. It will be appreciated that computer system 400 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method of estimating a life of a battery pack comprising a plurality of battery cells, the method comprising:

receiving cell-level test data comprising measured parameters of a first battery cell included in the battery pack in response to a plurality of test conditions, the first battery cell comprising a battery cell of the plurality of battery cells included in the battery pack;

determining one or more cell thermal response parameters associated with the first battery cell;

generating a battery cell aging model based, at least in part, on the cell-level test data and the one or more cell thermal response parameters;

determining one or more pack thermal response parameters associated with the battery pack, wherein determining the one or more second thermal response parameters comprises performing a regression using pack thermal data included in pack-level test data comprising measured parameters of the plurality of battery cells of the battery pack in response to the plurality of test conditions; and estimating a life of the battery pack based, at least in part, on the battery cell aging model and the pack thermal response parameters.

2. The method of claim 1, wherein the plurality of test conditions comprise at least one of cell ambient temperature conditions, cell root-mean-squared power conditions, cell state of charge conditions, cell set point conditions, and cell duty cycle conditions.

3. The method of claim 1, wherein the cell thermal response parameters comprise at least one of a thermal resistive parameter, a heat transfer coefficient parameter, an entropic parameter, and a maximum temperature parameter.

4. The method of claim 1, wherein the pack thermal response parameters comprise at least one of a thermal resistive parameter, a heat transfer coefficient parameter, an entropic parameter, and a maximum temperature parameter.

5. The method of claim 1, wherein the measured responses of the first battery cell comprise information relating to performance degradation of the battery cell over time based on the plurality of test conditions.

6. The method of claim 1, wherein determining the one or more cell thermal response parameters comprises performing a regression using cell thermal data included in the cell-level test data.

7. The method of claim 1, wherein determining the one or more cell thermal response parameters comprises generating a battery cell thermal model configured to estimate a thermal response of the first battery cell.

8. The method of claim 1, wherein determining the one or more pack thermal response parameters comprises generating a battery pack thermal model configured to estimate a thermal response of the battery pack.

9. The method of claim 1, wherein estimating the life of the battery pack comprises estimating a pack capacity life.

10. The method of claim 1, wherein estimating the life of the battery pack comprises estimating a pack resistance life.

* * * * *